(12) United States Patent
Kurosawa et al.

(10) Patent No.: US 6,667,468 B2
(45) Date of Patent: Dec. 23, 2003

(54) MOS-BASED IMAGE SENSOR AND METHOD OF FORMING BLACK-LEVEL SIGNAL THEREFOR

(75) Inventors: Susumu Kurosawa, Tokyo (JP); Yoshinori Muramatsu, Tokyo (JP)

(73) Assignee: NEC Electronics Corporation, Tokyo (JP)

( * ) Notice: Subject to any disclaimer, the term of this patent is extended or adjusted under 35 U.S.C. 154(b) by 324 days.

(21) Appl. No.: 09/865,527

(22) Filed: May 29, 2001

(65) Prior Publication Data

US 2001/0052574 A1 Dec. 20, 2001

(30) Foreign Application Priority Data

May 30, 2000 (JP) ........................................ 2000/159724

(51) Int. Cl.⁷ .............................. H01L 27/00; H04N 3/14
(52) U.S. Cl. ..................... 250/208.1; 348/308; 257/291
(58) Field of Search .......................... 250/208.1, 214 R, 250/214.1; 348/241, 243, 300, 301, 302, 308; 257/290, 291, 292

(56) References Cited

U.S. PATENT DOCUMENTS

2001/0028392 A1 * 10/2001 Yamamoto et al. ......... 348/207

FOREIGN PATENT DOCUMENTS

| JP | 5-23549 | 4/1993 |
| JP | 2000-31450 | 1/2000 |
| JP | 2000332969 A | * 11/2000 ............ H04N/1/19 |

OTHER PUBLICATIONS

Mendis et al., "A 128×128 CMOS Active Pixel Image Sensor for Highly Integrated Imaging Systems", IEDM 93–583, pp. 22.6.1–22.6.4.
Panicacci et al., "128Mb/s Multiport CMOS Binary Active–Pixel Image Sensor", ISSCC96/Session 6/2–D Array Processors and Image–Based Sensors/Paper TP 6.5, IEEE International Solid–State Circuits Conference, 1996, pp. 100–101.
Korea Office Action dated Apr. 24, 2003 with Japanese Translation and Partial English Translation.

* cited by examiner

Primary Examiner—Kevin Pyo
(74) Attorney, Agent, or Firm—McGinn & Gibb, PLLC

(57) ABSTRACT

There is disclosed a black-level signal generation circuit for use with a CMOS-based active pixel image sensor. This black-level signal generation circuit delivers a black-level signal of a constant level at all times. The black-level signal generation circuit is equivalent in circuit configuration to any one of pixels forming an effective pixel array and any one of readout portions for reading out signals from the pixels. A photodiode is maintained in a reset state. MOS transistors whose corresponding MOS transistors are turned 'ON/OFF' in any one of the pixels and any one of the readout portions are all kept in 'ON' state. Thus, the black-level signal generation circuit can constantly produce a black-level signal equivalent in level to the pixel signal delivered when no light is incident on the effective pixels.

22 Claims, 10 Drawing Sheets

MOS-BASED IMAGE SENSOR AND METHOD OF FORMING BLACK-LEVEL SIGNAL THEREFOR

BACKGROUND OF THE INVENTION

1. Field of the Invention

The present invention relates to a solid state image sensor and, more particularly, to a black-level signal generation circuit employed in a CMOS (Complementary Metal-Oxide-Semiconductor) image sensor as a solid state image sensor.

2. Description of the Related Art

A CMOS image sensor can be fabricated by use of the CMOS process for logic LSIs. Therefore, the CMOS image sensor contains, on a single semiconductor chip, photo-sensor units or pixels and a signal processing circuit such as control logic, unlike a CCD-based image sensor. Furthermore, the CMOS image sensor has an advantage that it has lower noise than usual MOS-based image sensors, because each cell or pixel includes a photodetector and a charge-to-signal conversion circuit so that the conversion of the charge detected by the photodetector in response to light irradiated thereto into an electrical signal as well as the amplification of the signal thus converted are performed within each pixel.

This kind of image sensor is described, for example, by Sunetra K. Mendis et al., "A 128×128 CMOS Active Pixel Image Sensor for Highly Integrated Imaging System" (IEEE International Electron Devices Meeting 93, pp. 583–586) and by Roger A. Panicacci et al., "128 Mb/s Multiport CMOS Binary Active-Pixel Image Sensor" (1996 IEEE International Solid-State Circuits Conference pp. 100–101). Methods of reading out pixel information of an image sensor as described in these references are as follows.

In the Mendis et al. CMOS sensor, charge responsive to a light that has been illuminated to a photodetector for a given time is read out as an electrical signal onto a vertical signal line through a first source-follower consisting of an input transistor and a row-selection transistor. The potential of the vertical signal line is sampled on a capacitor by enabling a sample switch. Each potential at each capacitor is read out through second and third source-followers respectively, by enabling column-selection transistors attached to these source-followers. An image signal is created using these two kinds of voltage signals.

In the Panicacci et al. CMOS sensor, on the other hand, pixels are formed in the same way as the Mendis et al. pixels. However, the circuit of a readout portions has a signal detection capacitor whose one end is connected with a sample switch, the other end being connected with the gate of the input transistor of an output side source-follower. The photodiode is exposed to a light for a given time. Then, the voltage across this photodiode is read out into a column signal line through an input side source-follower. This voltage is sampled in the signal detecting capacitor by enabling the sample switch and is read out through the output side source-follower. Then, this voltage is compared with an externally applied threshold voltage. Required pixel information is obtained using this thresholded voltage.

Generally, a signal processing circuit of a image sensor needs a black-level signal forming a reference potential. Usual method of forming and way of using such a black-level signal are next described by referring to FIG. 1, which is a block diagram of the conventional MOS-based image sensor, in which a source-follower input transistor is included within each pixel. In FIG. 1, pixels are arranged in a plurality of rows and a plurality of columns to form an effective pixel array 111. A vertical scanning circuit 113 selects each of a plurality of rows in the effective pixel array 111 successively. And, all pixels in selected row are reset at a time or read out into vertical signal lines at a time. Both of the resetting operation and the operation for reading out into vertical signal lines are under control of a vertical scanning circuit 113.

Output signals from the selected row of pixels are stored in a readout circuit 115, until they are delivered sequentially. This operation for delivering the signals from the readout circuit 115 sequentially is controlled by a horizontal scanning circuit 114.

The output signal from the readout circuit 115 has an offset component corresponding to a black level, which represents a state in which there is no incident light. The amount of this offset component differs among different circuit configurations of pixels and readout circuit.

Therefore, the offset component corresponding to a black level is subtracted from each signal of pixels in the effective pixel array 111 in the manner described below. Referring again to FIG. 1, a light-shielded pixel array 112 covered with a light-shielding film to prevent incidence of light is arranged around the effective pixel array 111. Shielded pixels are read out in the same way as effective pixels. Output signals from the shielded pixels are passed through the readout circuit 115, then separated from the effective pixel signals, and then stored in an analog storage circuit 116. In a signal level adjusting circuit 117, an offset component stored in the analog storage circuit 116 is subtracted from the effective pixel signal.

Then, the output signal from this signal level adjusting circuit is applied to an A/D converter (not shown). At this time, an additional offset voltage may be added such that the black level of the output signal from the signal level adjusting circuit matches the level of the lower-voltage side of the input voltage range of the A/D converter. Also, in this case, the black-level signal held in the analog storage circuit 116 is utilized.

In some sensors, a black-level signal generation circuit may be disposed apart from the pixel array. FIG. 2 is a block diagram schematically showing such image sensor accompanied with a black-level signal generation circuit, which is disclosed in Japanese Patent Publication Hei 5-23549. In this image sensor, a second photo-sensor cell 204 coated with a light-shielding film is provided besides photo-sensor cells constructing a photo-sensor array 201. A black-level signal is read out from the photo-sensor cell 204, being synchronized to the read-out timing signal of the photo-sensor array 201, and stored in a storage circuit 205. Then, a light information signal is obtained by subtracting the black-level signal stored in the storage circuit 205 from the output signal read out sequentially from the photo-sensor array 201 using a differential amplifier 202.

In the conventional MOS-based image sensors according to the prior arts described above, it is necessary that the black-level signal and the effective pixel signal should be separated from each other and that the black-level signal should be stored in the analog storage circuit. Therefore, a timing signal generating circuit for producing a timing pulse for separating the black-level signal from the effective pixel signal and the analog storage circuit are necessitated.

FIG. 3 is a block diagram schematically showing an image sensor creating a black-level signal by an electric circuit, which is disclosed in the above Japanese patent publication. A light information signal is obtained by subtracting a black-level signal formed using a constant current source 203 constructed from a constant voltage source and a variable resistor from an output signal read out from a photo-sensor array 201 using a differential amplifier 202. In the method, however, after the chip of the image sensor is completed or after the chip is incorporated into an imager, it is necessary to adjust the voltage value of the constant voltage source and/or the resistance value of the variable resistor for each individual commercial product of the chip to obtain a suitable level for the black-level signal.

SUMMARY OF THE INVENTION

Therefore, it is a main object of the present invention to provide a solid state image sensor having an improved black-level signal generation circuit.

It is another object of the present invention is to provide a CMOS image sensor that has a simplified black-level signal generation circuit.

It is still another object of the present invention is to provide a MOS-based image sensor that does not need an analog storage circuit that would be normally used to store a black-level signal.

It is another object of the present invention to provide a MOS-based image sensor that does not need a timing signal generating circuit that would be usually required to separate a black-level signal from an effective pixel signal.

It is still another object of the present invention to provide a MOS-based image sensor having a black-level signal forming means that makes it unnecessary to adjust a voltage value of a constant voltage source and/or a resistance value of a variable resistor for each individual image sensor chip singly.

An image sensor according to the present invention includes a plurality of pixels and a black-level signal generation circuit. Each pixel has a photo-detector or photo-sensor that generates charge in response to a light illuminated thereto and a signal producing circuit that produces an electrical signal in response to the charge generated by the photo-sensor. In accordance with the present invention, the black-level signal generation circuit is constructed to produce a black-level signal that is substantially equivalent to such a signal that is produced by the pixel upon being subjected to a reset state.

In a pure technical aspect, the black-level signal is required to have the so-called "dark current" component that is generated by the photo-sensor itself and a signal component that is inherently produced by the signal producing circuit irrespective of the charge generated by the photo-sensor. Such signal component will be called "inherent signal component" hereinafter. The dark current component corresponds to such a signal that is generated by the photo-sensor that is activated under a light-shielded condition, i.e., under a dark condition. These two components are irrelevant to the pure signal that is truly responsive to the charge which is generated by the photo-sensor according to the intensity of the light.

The inventors of the present invention have, however, recognized that the dark current component is not always necessary for some applications of an image sensor. For example, in mobile gears such as handy PCs or cellular phones equipped with an image sensor to transmit images such as pictures to a receiver, the picture quality of such images is not required to be high. Rather, a high cost-performance is required to such an image sensor that is to be installed into the mobile gears. In addition, the dark current component itself has been lowered in accordance with the progress in device structure and/or manufacturing process of a photo-sensor. Based on this recognition, the dark current component is no longer taken into account and thus can be ignored. As a result, the black-level signal generation circuit according to the present invention is so arranged as to generate, as a black-level signal, such a signal that is substantially equivalent to a signal which is produced by the pixel upon being subjected to a reset state. This signal thus corresponds to the "inherent signal component".

Since the dark current component is not used as a black-level signal, any photo-sensor that is to be shielded from the light for obtaining the dark current component is no longer necessary. Even a photo-sensor used for generating a black-level signal may be omitted. Moreover, any timing control or any analog storage circuit, which would be otherwise required in the prior art sensors, is not required. The black-level signal generation circuit according to the present invention can produce a black-level signal as a DC signal. Thus, the image sensor according to the present invention presents a high cost performance, which is one of key factors for mobile gears.

According to the another aspect of the present invention, there is provided a black-level signal generation circuit for a MOS-based image sensor, wherein the black-level signal generation circuit is equivalent in circuit configuration to any one of pixels producing effective pixel signals and any one of readout portions for reading out the effective pixel signals. This black-level signal generation circuit can constantly produce an output signal equivalent to an effective pixel signal delivered from any one of readout portions when the pixels are in a reset state. The black-level signal generation circuit may contain all circuit elements which are equivalent in function to circuit elements included in any one of the pixels and any one of the readout portions delivering effective pixel signals. However, if some of these circuit elements can be omitted or replaced with electric conductors without substantially affecting the value of the level of the produced black-level signal, then such circuit elements can be omitted or replaced with the electric conductors. A power-supply voltage or a ground potential is supplied to the gates of MOS transistors included in the black-level signal generation circuit whose corresponding MOS transistors are turned 'ON/OFF' in any one of the pixels and any one of the readout portions, whereby the MOS transistors are kept 'ON'. If there is any light-receiving element within the black-level generation circuit, the light-receiving element is maintained in a reset state. In the present invention, more than one black-level signal generation circuit can be formed. Only one black-level signal generation circuit can be also used.

The foregoing and other objects of the present invention, together with its novel features, will become more apparent when the following detailed description is read with reference to the accompanying drawings. Note that the drawings are for illustrative purposes only and not intended to limit the scope of the invention.

DESCRIPTION OF THE PREFERRED EMBODIMENTS

Figure 4:
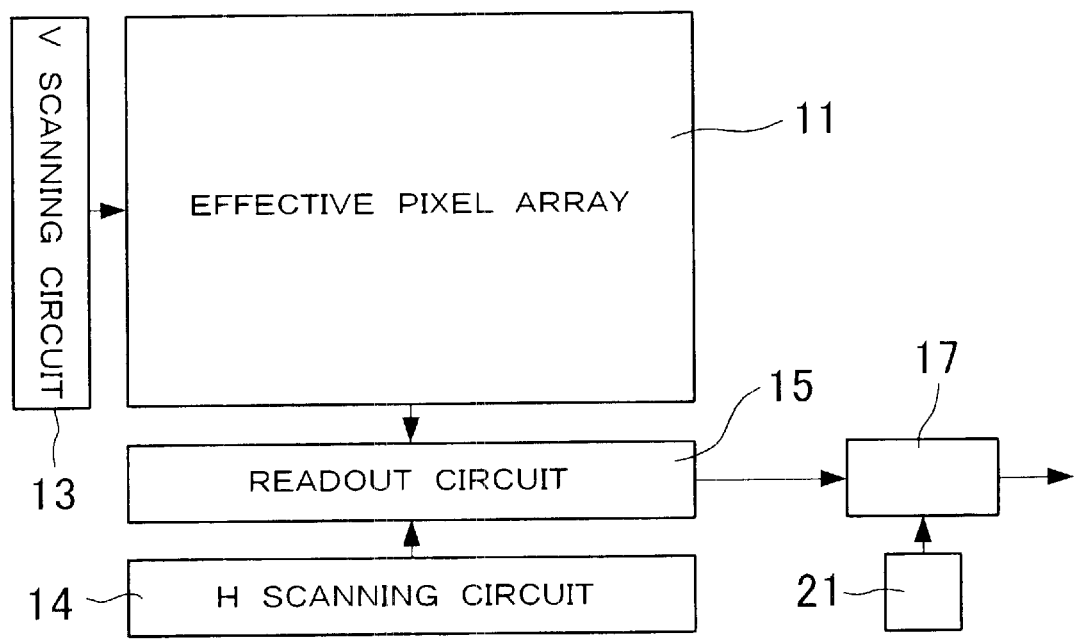
FIG. 4 is a block diagram schematically showing a structure of a MOS-based image sensor in accordance with the present invention.

Referring now to FIG. 4, a CMOS image sensor according to a first embodiment of the present invention includes an effective pixel array 11 in which pixels are arranged in a plurality of rows and a plurality of columns. All pixels in each of a plurality of rows are connected with each row-selecting line from a vertical scanning circuit 13, and are selected simultaneously. The effective pixel array 11 is connected with a readout circuit 15. Output signals from the row selected by the vertical scanning circuit 13 are sent to the readout circuit 15 consisting of an array of readout portions corresponding to individual columns and stored for a certain time period. A horizontal scanning circuit 14 and a signal level adjusting circuit 17 are connected with the readout circuit 15. The signals stored in the readout circuit 15 are selected by column-selecting signals applied from the horizontal scanning circuit 14 one by one, and transferred to the signal level adjusting circuit 17. The vertical scanning circuit 13 and the horizontal scanning circuit 14 are controlled by a control logic (not shown), for supplying a row-selecting signal to each of a plurality of rows and for supplying a column-selecting signal to each of a plurality of columns, respectively.

Figure 1:
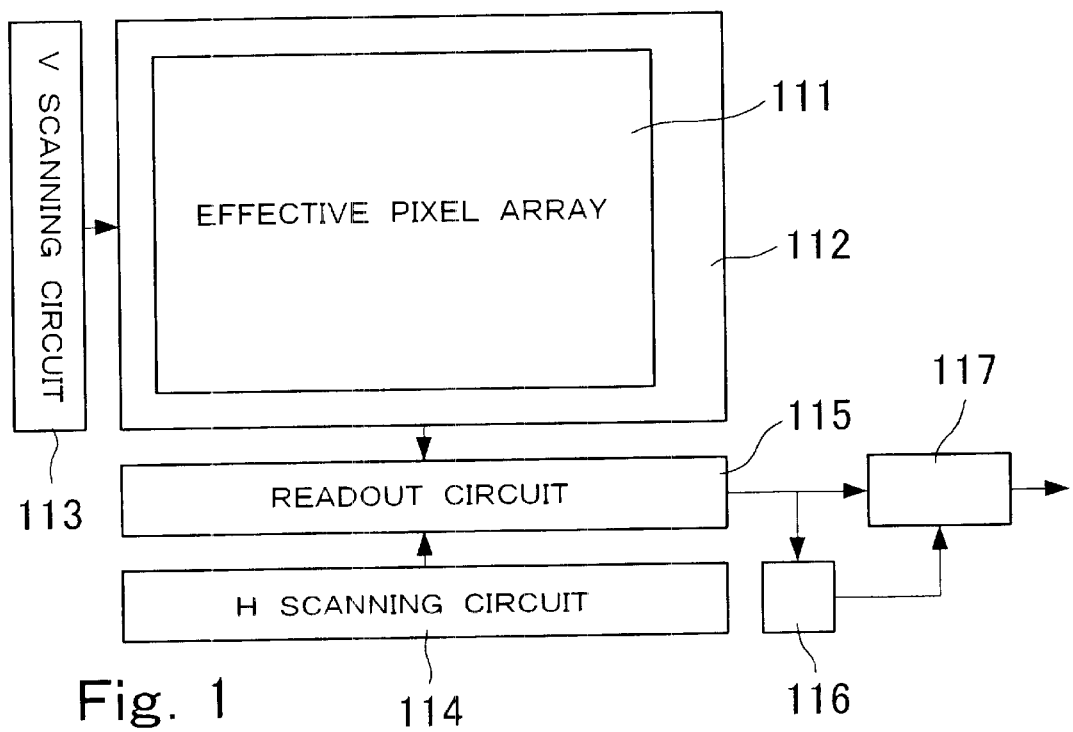
FIG. 1 is a block diagram of a conventional MOS-based image sensor.
Figure 2:
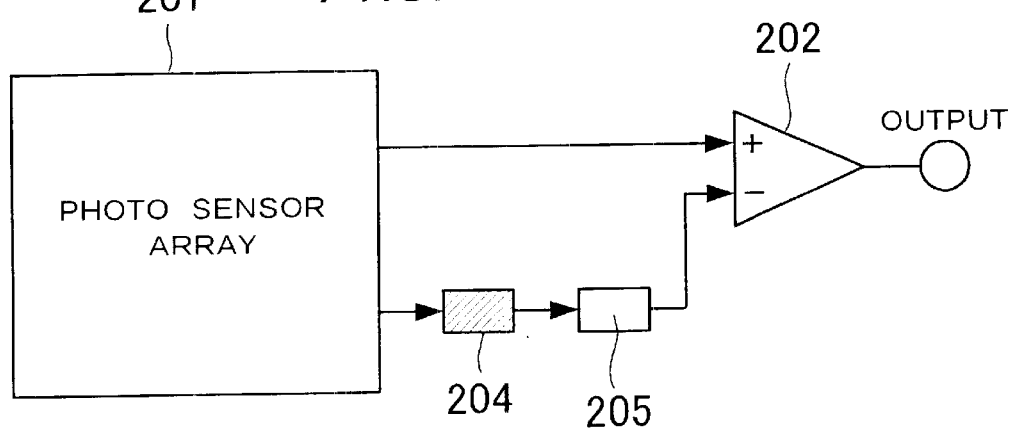
FIG. 2 is a block diagram of a conventional image sensor accompanied with a black-level signal generation circuit.
Figure 3:
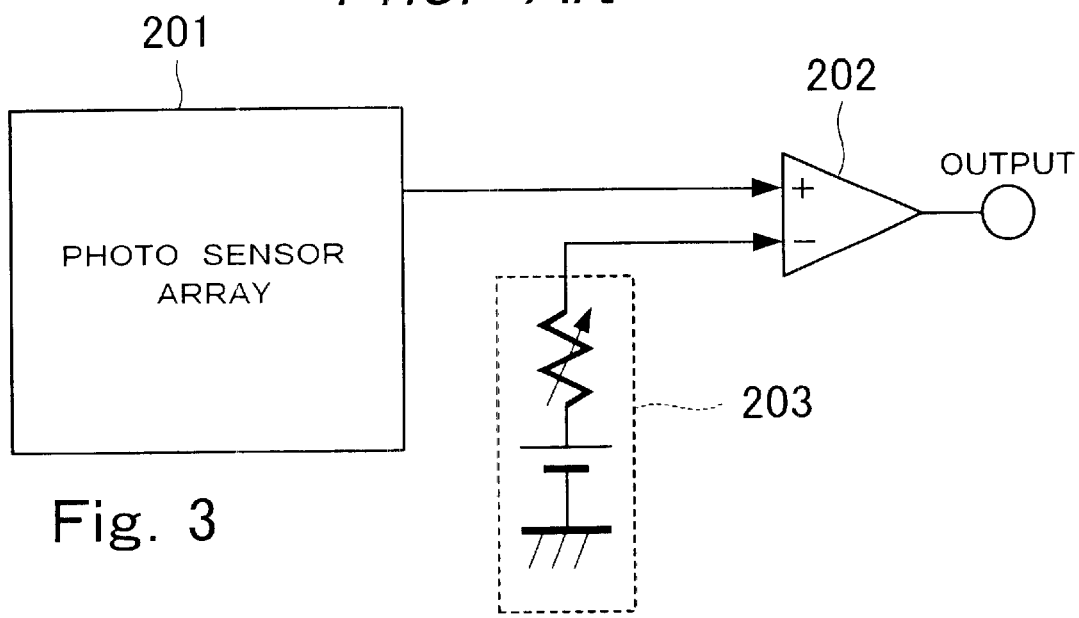
FIG. 3 is a block diagram of a conventional image sensor creating a black-level signal by an electric circuit.

In accordance with the present invention, a black-level signal generation circuit 21 is connected with the signal level adjusting circuit 17, to form a signal that is obtained by subtracting the black-level signal applied from the black-level signal generation circuit 21 from the signal of each of pixels within the effective pixel array 11. No light-shielded array is arranged around the effective pixel array 11 in accordance with the present embodiment, unlike the conventional solid state image sensor shown in FIG. 1. In addition, the black-level signal generation circuit 21 is provided without analog storage circuit 116 that would be otherwise required in the image sensor shown in FIG. 1.

In circuit elements and circuit configuration, the black-level signal generation circuit 21 according to the present embodiment is equivalent to the circuit of any one of the pixels within the effective pixel array 11 and any one of the readout portions in the readout circuit 15. However, it should be noted that some of the circuit elements (e.g., a photodiode, a MOS transistor, or a capacitor) of the black-level signal generation circuit 21 can be omitted or replaced with electric conductors without substantially affecting the level of the produced black-level signal. Preferably, the circuit elements included in the black-level signal generation circuit 21 are made equal in size with their corresponding circuit elements within the effective pixel array 11 and within the readout circuit 15. MOS transistors included in the black-level signal generation circuit 21 whose corresponding MOS transistors are turned 'ON/OFF' in any one of the pixels and any one of the readout portions are all kept at 'ON' state except when no black-level signal is required. In case where a photodiode is included in the black-level signal generation circuit, the photodiode is kept in a reset state. With the black-level signal generation circuit constructed in this way, a black-level signal can be obtained equivalently in level to a pixel signal which is read from a pixel in a reset state within the effective pixel array, without making any special adjustment after completing the fabrication of the image sensor chip.

Figure 5:
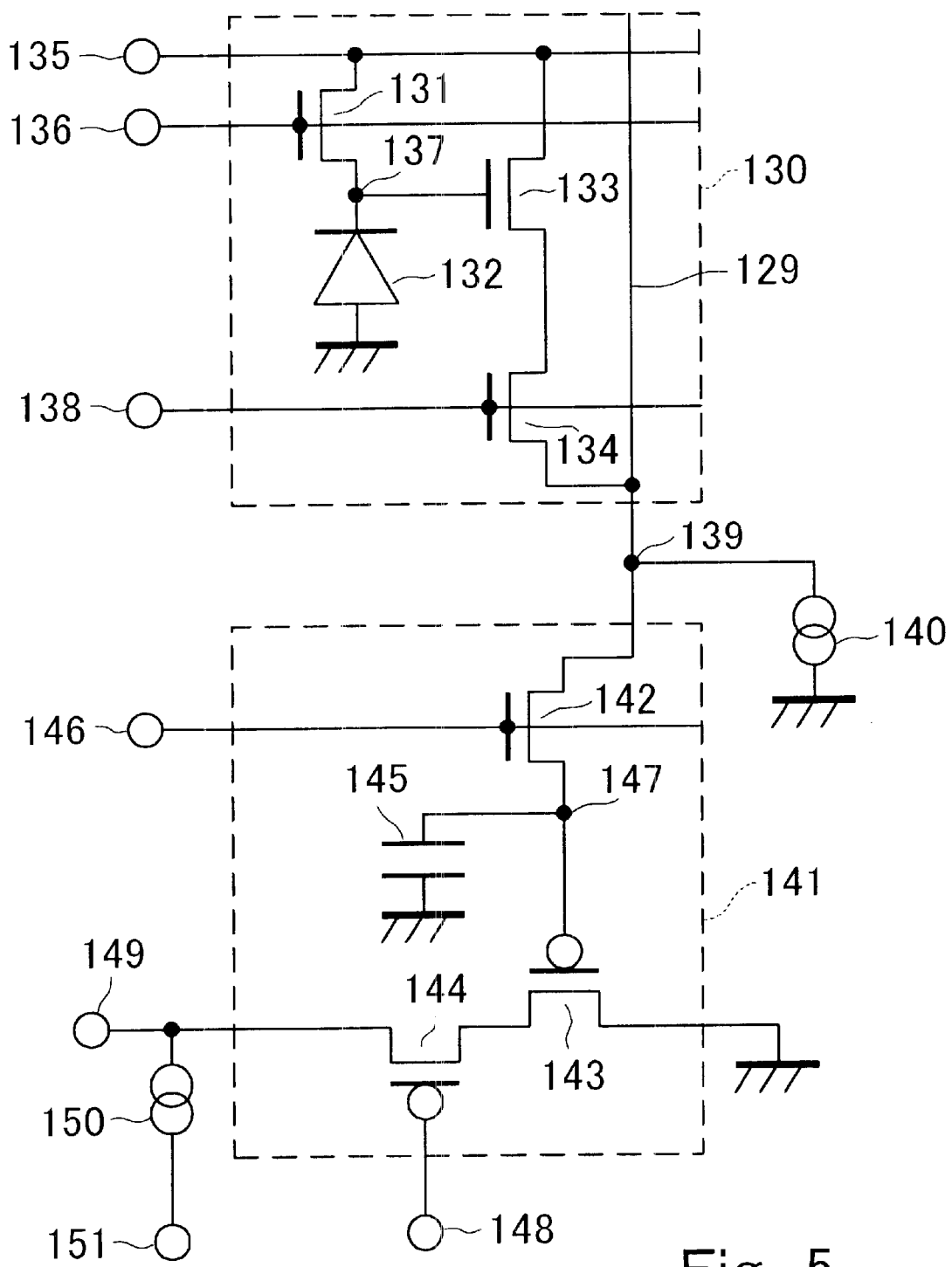
FIG. 5 is a circuit diagram of a pixel and a readout portion in accordance with a first embodiment of the present invention.

Turning to FIG. 5, there is shown one pixel 130. It is to be noted that the pixel 130 is in fact arranged in a plurality of rows and a plurality of columns to constitute the effective pixel array 11. There is further shown a readout portion 141 which is a part of the readout circuit 15 and is provided correspondingly to one column. The pixels 130 in each one column are all connected with the corresponding one of the readout portions 141. These readout portions 141 are arranged in columns equal in number with the columns of the pixels to form the readout circuit 15.

A photodiode 132 as a photo-sensor has one end connected with a node 137, the other end being grounded. The gate of an N-channel MOSFET 133 for signal amplification and the source of an N-channel MOSFET 131 for resetting are connected with the node 137. The gate of the resetting MOSFET 131 is connected with a terminal 136. A resetting signal supplied from the vertical scanning circuit via the terminal 136 turns the resetting MOSFET 131 at 'ON' state, thus resetting the potential at the node 137 to the reset voltage. The drain of the resetting MOSFET 131 together with the drain of the signal amplification MOSFET 133 is connected with a terminal 135 to which a power-supply voltage $V_{cc}$, for example, is applied. The source of the signal amplification MOSFET 133 is connected with the drain of an N-channel MOSFET 134 for row selection. The gate of this row-selecting MOSFET 134 is connected with a terminal 138. By depending whether a row selection signal is applied to the gate of the row-selecting MOSFET 134 from the vertical scanning circuit via the terminal 138, 'ON/OFF' state of the row-selecting MOSFET 134 is decided. The drain of the row-selecting MOSFET 134 together with one end of a current source 140 is connected with a node 139 on a vertical signal line 129. The other end of the current source 140 is grounded. The signal amplification MOSFET 133, the row selecting MOSFET 134, and the current source 140 together constitute a source-follower. A signal corresponding to the potential at the node 137 is output to the node 139 through the source-follower.

The node 139 of the vertical signal line is also connected with the drain of a sample-and-hold MOSFET 142 of an N-channel type. The gate of this sample-and-hold MOSFET 142 is connected with a terminal 146 for applying a sample-and-hold signal. The source of the sample-and-hold MOSFET 142 is connected with a node 147 with which one end of a capacitor 145 and the gate of a signal amplification MOSFET 143 of a P-channel type are connected. The other end of the capacitor 145 is grounded. The drain of the signal amplification MOSFET 143 is grounded, while its source is connected with the drain of a column-selecting MOSFET 144 of a P-channel type. A column-selecting signal is applied from the horizontal scanning circuit to the gate of the column-selecting MOSFET 144 via a terminal 148. The source of the column-selecting MOSFET 144 is connected with one end of a current source 150 and with a terminal 149. The signal amplification MOSFET 143, the column-selecting MOSFET 144, and the current source 150 together constitute a source follower. The other end of the current source 150 is connected with a terminal 151 to which the power-supply voltage $V_{cc}$, for example, is applied.

When a row is selected, each of pixels 130 in the selected row outputs a pixel signal to the node 139 of the vertical signal line 129. Then, the sample-and-hold MOSFET 142 is turned at 'ON' state by supplying a sample-and-hold signal from the terminal 146, and the signal is temporarily held in the capacitor 145. The signal corresponding to the potential at the node 147 is output to the terminal 149 connected with the horizontal signal line, through the source-follower made up of the signal amplification MOSFET 143, the column-selecting MOSFET 144 and the current source 150. It is to be noted that the circuit shown in FIG. 5 is equivalent to the circuit disclosed by the Mendis et al. article.

Figure 6:
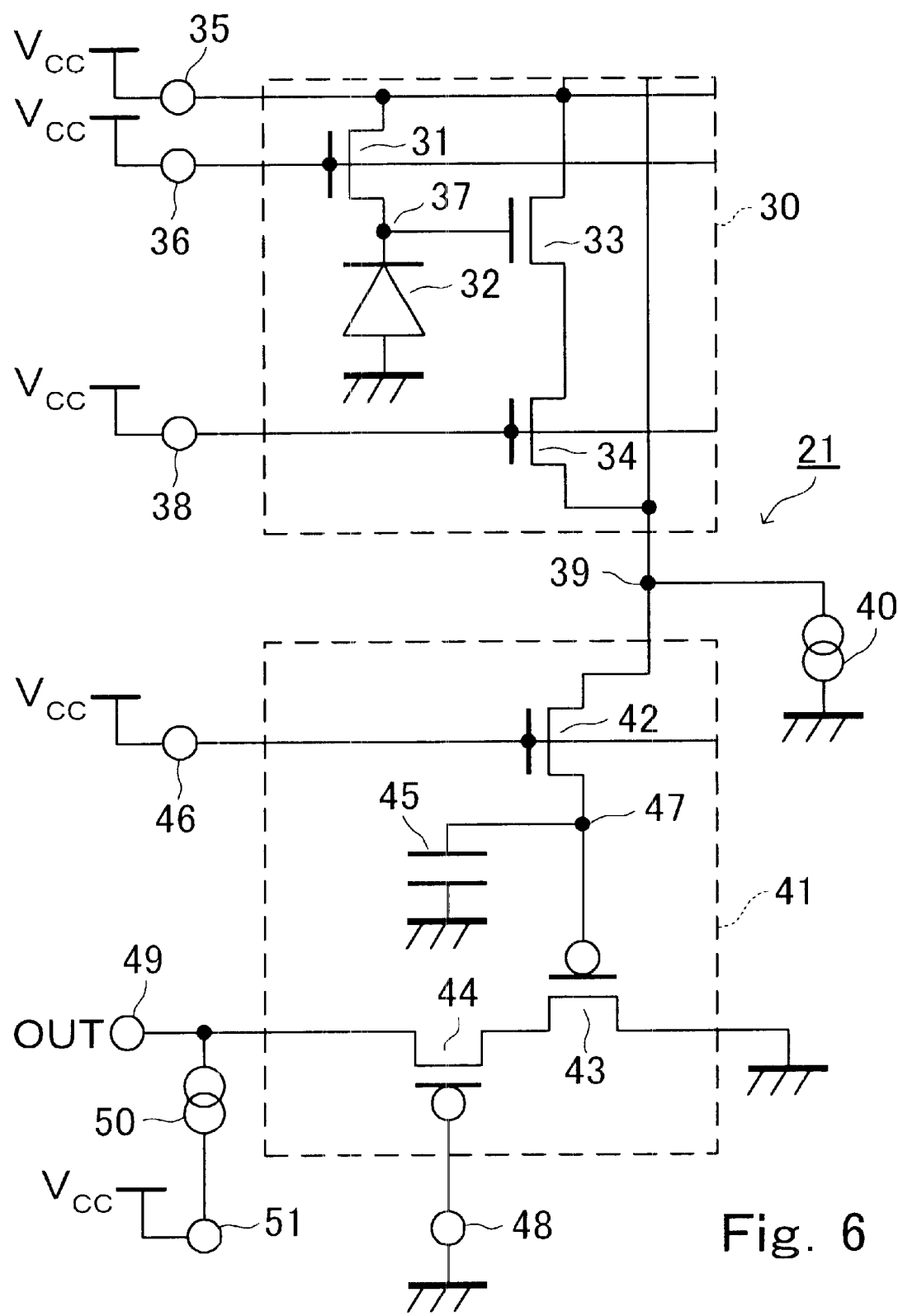
FIG. 6 is a circuit diagram of a black-level signal generation circuit in accordance with the first embodiment of the present invention.

Referring now to FIG. 6, there is illustrated a circuit diagram showing the black-level signal generation circuit in accordance with the first embodiment of the present invention. In the present embodiment, the black-level signal generation circuit is identical in circuit configuration with any one of pixels and a readout portion for one column shown in FIG. 5. Corresponding MOSFETs, capacitors and so on are identical in size with each other. However, there is no need to shield this circuit 21 from light and thus no light-shielding layer is provided to cover it.

As shown in FIG. 6, the black-level signal generation circuit 21 is constituted with one pixel 30 and one readout portion 41, the pixel 30 being connected with the readout portion 41. One end of a photodiode 32 in the pixel 30 is connected with a node 37, while the other end is grounded. The gate of a signal amplification MOSFET 33 of an N-channel type and the source of a resetting MOSFET 31 of an N-channel type are connected with the node 37. The gate of the MOSFET 31 is connected with a terminal 36 that is supplied with a high level as shown to maintains the MOSFET 31 in 'ON' state, the potential at the node 37 being thereby held at the reset voltage. The drain of the MOSFET 31 together with the drain of the signal amplification MOSFET 33 is connected with a terminal 35 to which a power-supply voltage $V_{cc}$, for example, is applied. The source of the signal amplification MOSFET 33 is connected with the drain of a MOSFET 34 of an N-channel type. The source of the MOSFET 34 is connected with one end of a current source 40 and with a node 39. The other end of the current source 40 is grounded. The gate of the MOSFET 34 is connected with a terminal 38. A signal at high level is supplied to the gate of the MOSFET 34 via the terminal 38. Consequently, the MOSFET 34 is kept in 'ON' state at all times. This MOSFET 34 corresponds to the row-selecting MOSFET 134 shown in FIG. 5. The signal amplification MOSFET 33, the MOSFET 34, and the current source 40 constitute a source-follower. A signal corresponding to the potential at the node 37 is output to the node 39 through this source-follower.

The node 39 is also connected with the drain of a sample-and-hold MOSFET 42 of an N-channel type. The gate of the sample-and-hold MOSFET 42 is connected with a terminal 46. A signal that is kept in high level is supplied to this terminal 46, so that the sample-and-hold MOSFET 42 is kept in 'ON' state at all times. The source of the sample-and-hold MOSFET 42 is connected with a node 47 with which one end of a capacitor 45 and the gate of a signal amplification MOSFET 43 of a P-channel type are connected. The other end of the capacitor 45 is grounded. The drain of the signal amplification MOSFET 43 is grounded, whereas its source is connected with the drain of a P-channel MOSFET 44. A signal that is kept in low level is supplied to the gate of the MOSFET 44 via a terminal 48, whereby the MOSFET 44 is kept in 'ON' state at all times. This MOSFET 44 corresponds to the column-selecting MOSFET 144 shown in FIG. 5. The source of the MOSFET 44 is connected with one end of a current source 50 and with a terminal 49. Derived from the terminal 49 is a black-level signal as an output of the black-level signal generation circuit 21. The signal amplification MOSFET 43, the MOSFET 44, and the current source 50 constitute a source-follower. The other end of the current source 50 is connected with a terminal 51 to which the power-supply voltage $V_{cc}$, for example, is applied.

A signal read from the pixel 30 is output to the node 39 and then sent to the node 47, because the signal at high level supplied from the terminal 46 turns 'ON' the sample-and-hold MOSFET 42 at all times. A signal corresponding to the potential at the node 47 is output to the terminal 49 through the source-follower formed by the signal amplification MOSFET 43, the MOSFET 44 and the current source 50.

The operation of the black-level signal generation circuit in accordance with the present embodiment is described next in further detail. A signal that is kept at high level is always supplied to the terminal 36, bringing the resetting MOSFET 31 into 'ON' state and keeping the node 37 in reset potential at all times. A signal that is kept at high level is always supplied to the terminal 38. So, a signal corresponding to the potential at the node 37 is always output to the node 39 through a source-follower consisting of the signal amplification MOSFET 33, the MOSFET 34 and the current source 40. A signal that is kept at high level is always supplied to the terminal 46, maintaining the sample-and-hold MOSFET 42 in 'ON' state. So, the signal supplied to the node 39 is output to the node 47 at all times. A signal that is kept in low level is always supplied to the terminal 48. So, a signal corresponding to the potential at the node 47 is output to the terminal 49 through a source follower made up of the signal amplification MOSFET 43, the MOSFET 44 and the current source 50. In this way, a signal corresponding to reset state of the pixel 30, that is, a black-level signal, is invariably output via the terminal 49.

The black-level signal formed in this way is supplied to the signal level adjusting circuit 17 shown in FIG. 4 and used to adjust the pixel signal read from the readout circuit 15. As mentioned above, this black-level signal is formed under the condition that the signal at high level is supplied to the terminals 36 and 46 constantly and the signal at low level is supplied to the terminal 48 constantly. Therefore, this black-level signal is formed independently of pixel signals from the effective pixel array and has always a constant level. In consequence, the present invention dispenses with a timing signal generating circuit for forming a timing pulse for separating a black-level signal from a pixel signal. The invention also dispenses with an analog storage circuit for holding the black-level signal. The signals kept at high and low levels can be replaced by the power-supply potential $V_{cc}$ and ground potential, respectively.

Figure 7:
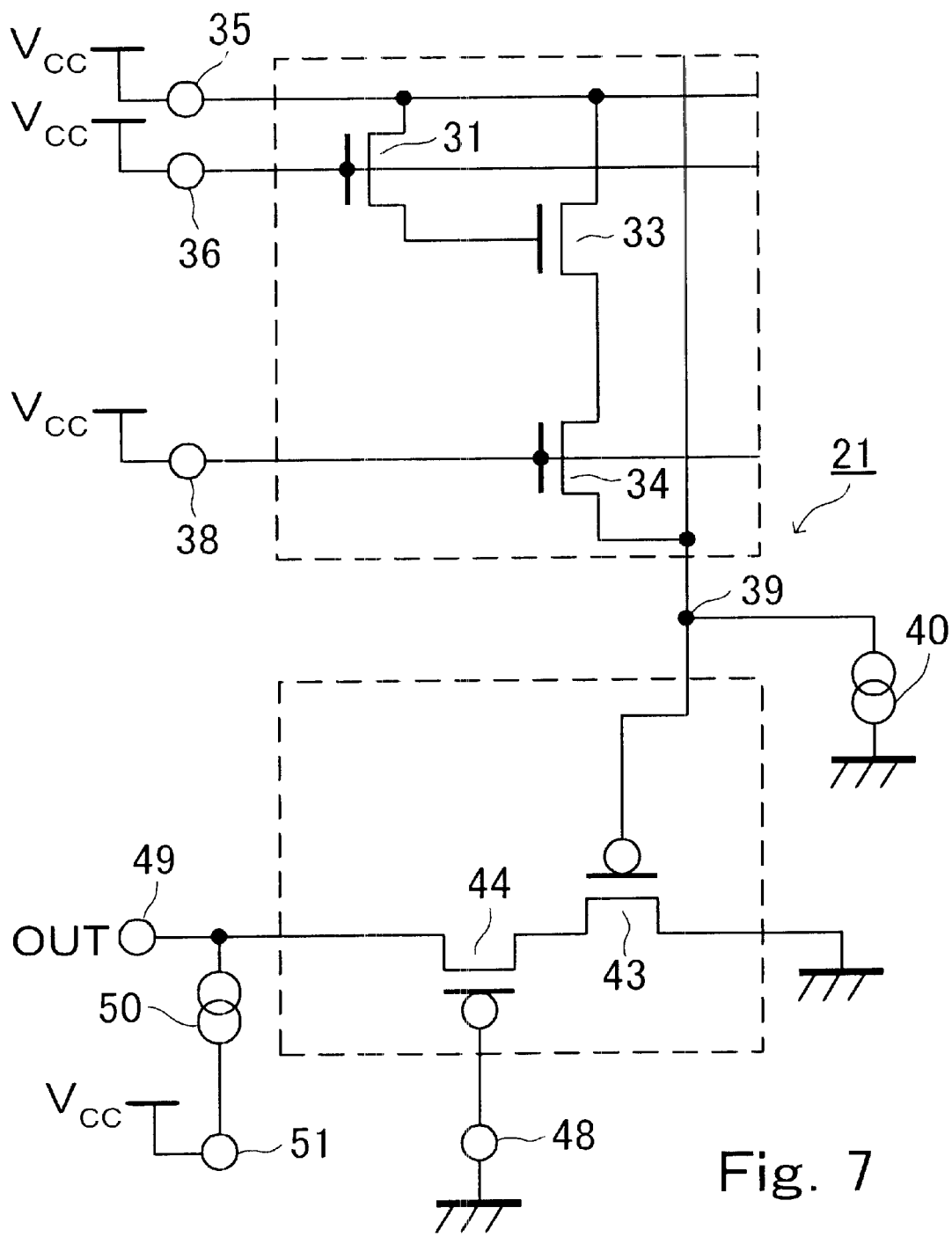
FIG. 7 is a circuit diagram of a modification of the black-level signal generation circuit in accordance with the first embodiment of the present invention.

In the present invention, the black-level signal can be generated at the black-level signal generation circuit 21 in FIG. 4. at all times. However, the black-level signal can be supplied to the signal level adjusting circuit 17 only when the pixel signals of the effective pixel array 11 stored in the readout circuit 15 are selected by column-selecting signals applied from the horizontal scanning circuit 14 and transferred to the signal level-adjusting circuit 17. When the black-level signal is not necessary, the outputting of the black-level signal may be stopped by supplying a signal at low level to the terminal 38 and a signal at high level to the terminal 48, so that the electric power consumption can be reduced. 'High/Low' of the signals supplied to the terminals 38 and 48 are controlled by a control logic (not shown). In the present embodiment, while the black-level signal is being output, the potential at the node 37 with which one end of the photodiode 32 is connected is invariably reset, a signal at high level is kept supplied to the gate of the sample-and-hold MOSFET 42 from the terminal 46 so that this MOSFET 42 is kept in 'ON' state, and a signal corresponding to a reset potential is kept supplied to the node 47 with which the capacitor 45 is connected. Therefore, all or some of these photodiode 32, sample-and-hold MOSFET 42, and capacitor 45 may be omitted. A circuit in which the photodiode 32, the MOSFET 42 and the capacitor 45 are omitted and the gate of the MOSFET 43 is directly connected with the node 39 is shown in FIG. 7.

Figure 8:
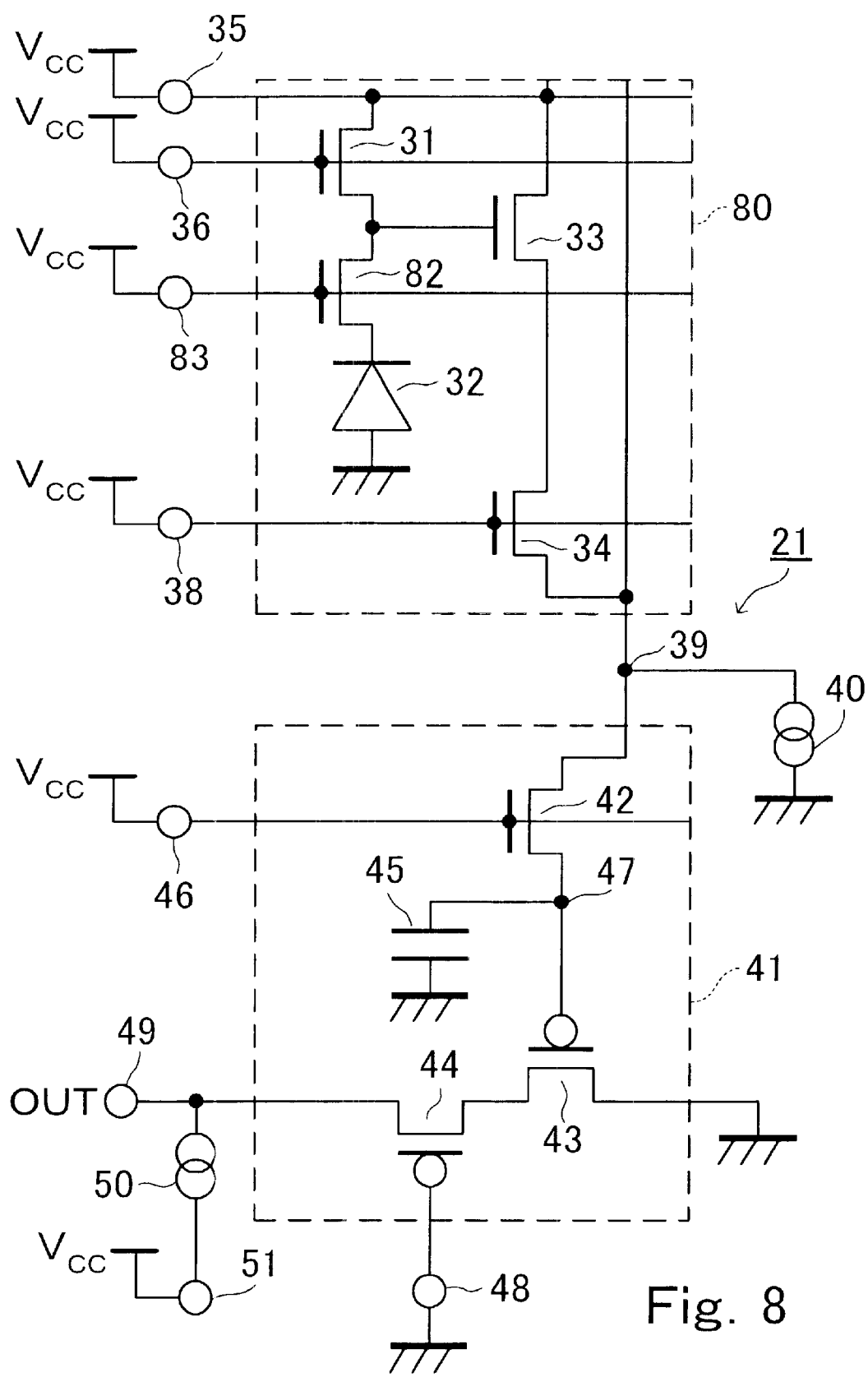
FIG. 8 is a circuit diagram of a black-level signal generation circuit in accordance with a second embodiment of the present invention.

A second embodiment of the present invention is next described. In the first embodiment, each of pixels forming the effective pixel array of an image sensor and a pixel for a black-level signal generation circuit are made up of three MOSFETs and one photodiode. The present invention can be applied to an image sensor having pixels of other structure. FIG. 8 is a circuit diagram showing a pixel and a readout portion of a black-level signal generation circuit in accordance with the second embodiment. Those components of the second embodiment shown in FIG. 8 which are the same as their counterparts of the first embodiment shown in FIG. 6 are indicated by the same numerals and symbols as in FIG. 6 and will be not described in detail.

As shown in FIG. 8, a pixel 80 in accordance with the present embodiment has a charge-transferring MOSFET 82 of an N-channel type added between a photodiode 32 and a signal amplification MOSFET 33. The source and drain of the charge-transferring MOSFET 82 are connected with one end of the photodiode 32 and the gate of the signal amplification MOSFET 33, respectively. The gate of the charge-transferring MOSFET 82 is connected with a terminal 83, which in turn supplies a signal at high level at all times. The pixel 80 constructed in this way and a readout portion 41 of the same construction as that of the first embodiment constitute a black-level signal generation circuit in accordance with the present embodiment. On the other hand, a pixel of the effective pixel array 11 in accordance with the present embodiment has the structure such as the pixel 130 accordance with the first embodiment shown in FIG. 5 added a charge-transferring MOSFET equivalent to that shown in FIG. 8. A readout portion of the readout circuit 15 in accordance with the present embodiment has the same structure as the readout portion 141 in accordance with the first embodiment shown in FIG. 5.

In the black-level signal generation circuit in accordance with the present embodiment, if some of the circuit elements can be omitted or replaced with electric conductors without substantially affecting the level of the produced black-level signal, then such circuit elements can be omitted or replaced with the electric conductors. That is, all or some of the photodiode 32, the MOSFET 82, and the capacitor 45 can be omitted. Furthermore, the MOSFET 42 can be replaced with an electric conductor.

Figure 9:
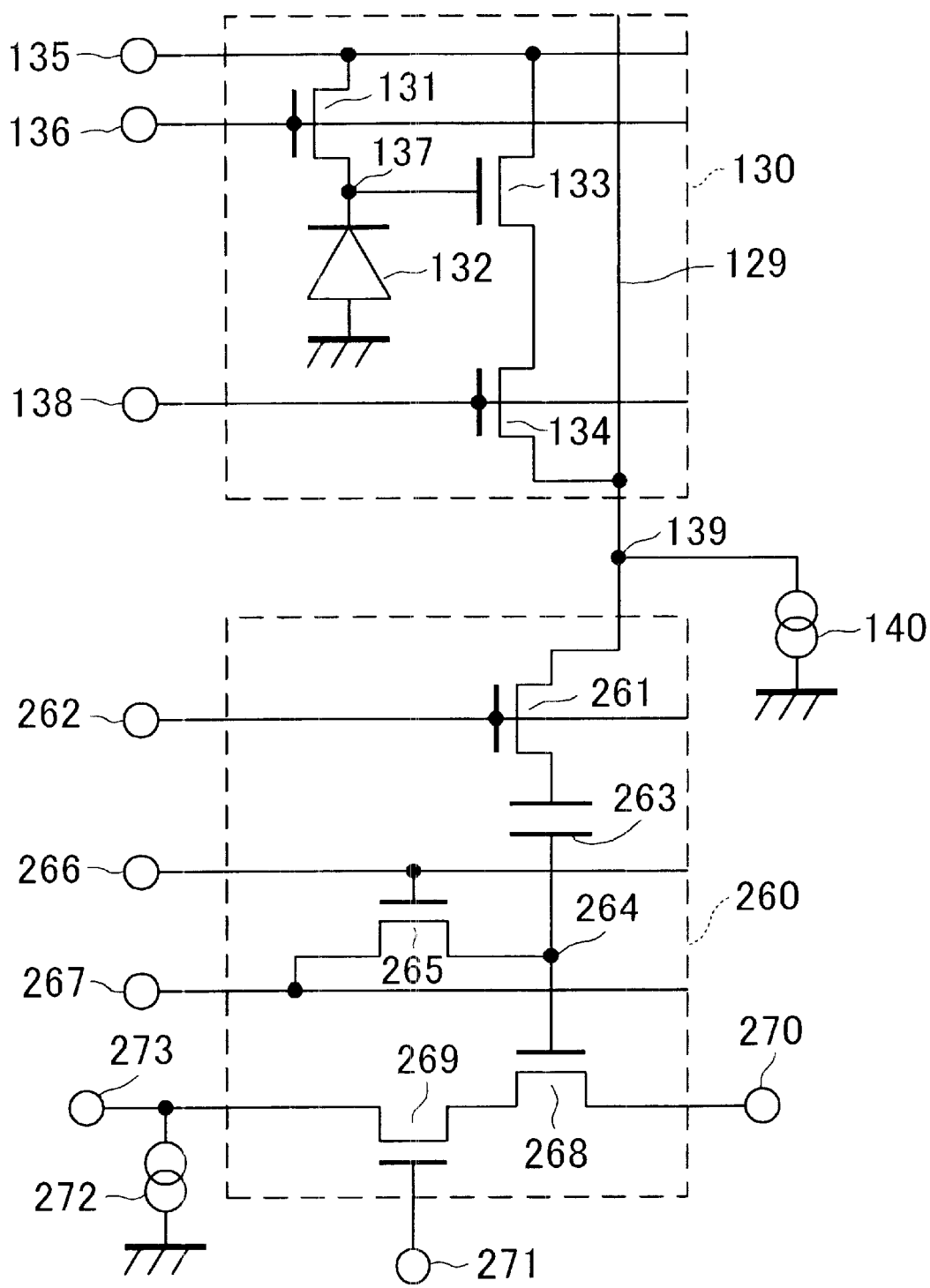
FIG. 9 is a circuit diagram of a pixel and a readout portion in accordance with a third embodiment of the present invention.
Figure 10:
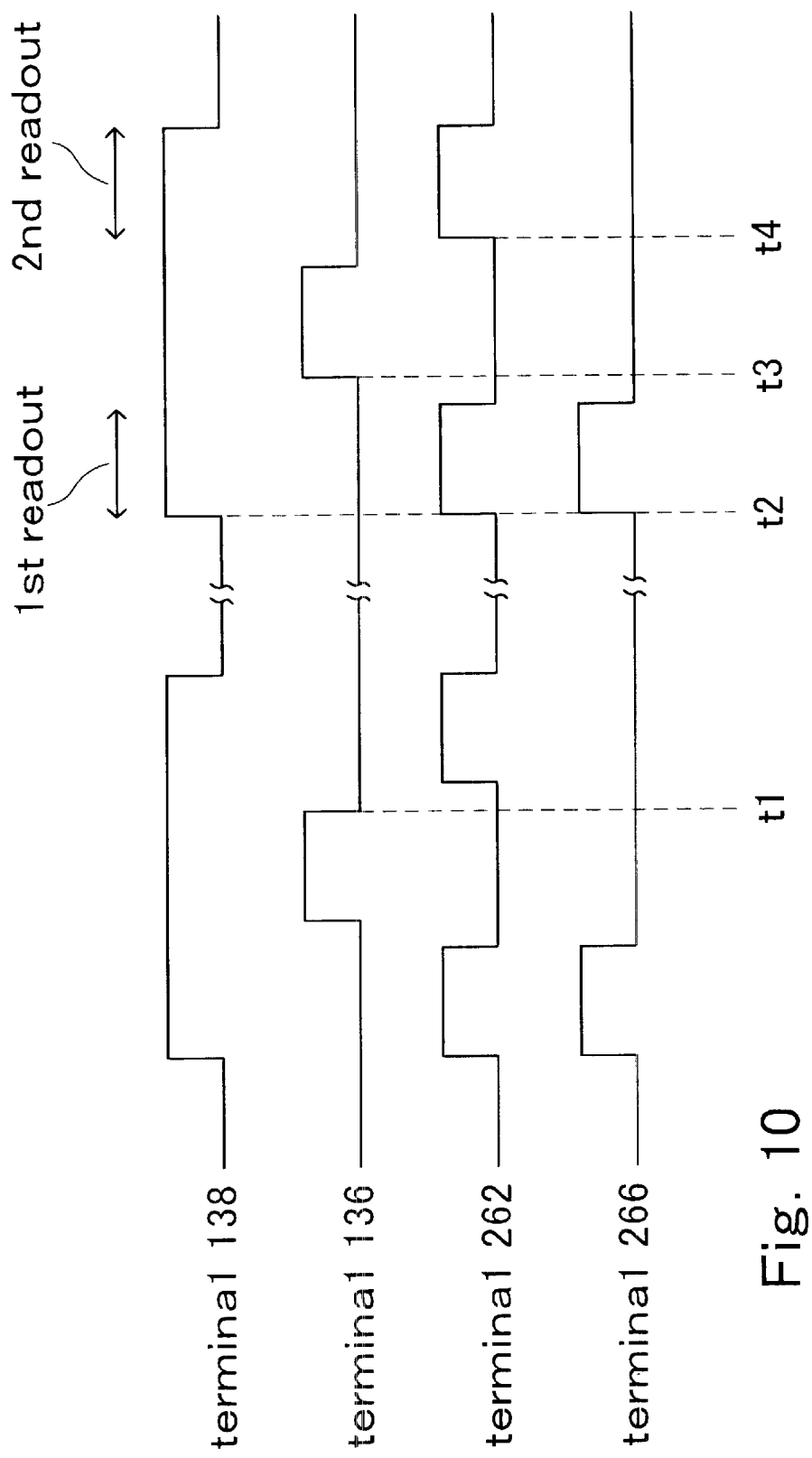
FIG. 10 is a timing chart illustrating the operation of the pixel and the readout portion in accordance with the third embodiment of the present invention.
Figure 11:
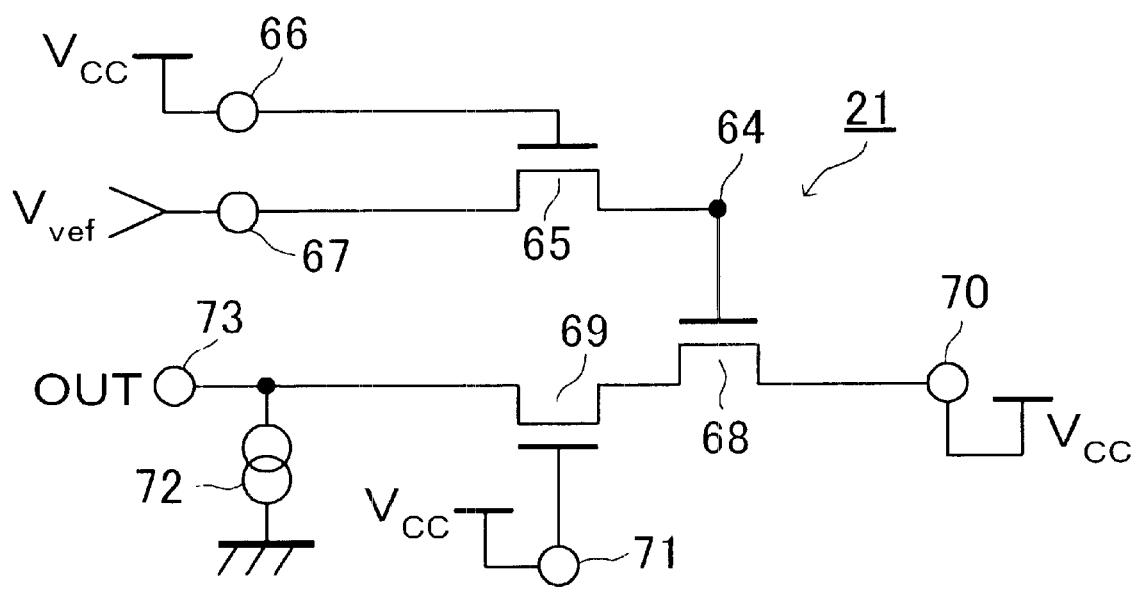
FIG. 11 is a circuit diagram of a black-level signal generation circuit in accordance with the third embodiment of the present invention.

A third embodiment of the present invention is next described by referring to FIGS. 9, 10, and 11. FIG. 9 is a circuit diagram showing any one of pixels and a readout portion for one column in accordance with the third embodiment. Pixels 130 are arranged in a plurality of rows and a plurality of columns to form the effective pixel array 11 shown in FIG. 4. One readout portion 260 is connected with one column of the pixels. The readout circuit 15 is constituted of the same number of the readout portions 260 as the columns of pixels 130. As shown in FIG. 9, a pixel in accordance with the present embodiment has the same structure as the pixel 130 shown in FIG. 5. That is, each pixel 130 is constituted of a photodiode 132, a resetting MOSFET 131 of an N-channel type, a signal amplification MOSFET 133 of an N-channel type, and a row-selecting MOSFET 134 of an N-channel type. One readout portion 260 per column of the pixels 130 reads out signals converted from light signals to electric signals at each pixel 130. The drain of an N-channel MOSFET 261 is connected with a node 139 of a vertical signal line 129. The gate of the MOSFET 261 is connected with a terminal 262 for applying a sample-and-hold signal. The source of the MOSFET 261 is connected with one end of a capacitor 263, the other end of the capacitor 263 being connected with a node 264. The drain of a switching MOSFET 265 of an N-channel type and the gate of a signal amplification MOSFET 268 of an N-channel type are also connected with the node 264. The gate of the switching MOSFET 265 is connected with a terminal 266. 'High/Low' of a signal applied to this terminal 266 decides 'ON/OFF' of the switching MOSFET 265. The source of the switching MOSFET 265 is connected with a terminal 267. A constant voltage $V_{ref}$ is supplied to the source of the switching MOSFET 265 via this terminal 267. The drain of the signal amplification MOSFET 268 is connected with a terminal 270 via which the power-supply voltage $V_{cc}$, for example, is supplied. The source of the signal amplification MOSFET 268 is connected with the drain of a column-selecting MOSFET 269 of an N-channel type. The gate of the column-selecting MOSFET 269 is connected with a terminal 271 via which a column-selecting signal is supplied from the horizontal scanning circuit. The source of the column-selecting MOSFET 269 is connected with one end of a current source 272 and with a terminal 273 connected with a horizontal signal line, the other end of the current source 272 being grounded. The signal amplification MOSFET 268, the column-selecting MOSFET 269, and the current source 272 constitute a source-follower. A signal corresponding to the signal voltage appearing at the node 264 is output to the horizontal signal line via the terminal 273. It should be noted that the circuit shown in FIG. 9 is equivalent to that disclosed by the Panicacci et al. article.

The operation of the pixel 130 and the readout portion 260 constructed in this way in the present embodiment is next described. FIG. 10 is a timing chart illustrating the operation of the pixel 130 and the readout portion 260. When the reset signal applied to the terminal 136 goes 'Low' at instant t1 in a frame, the MOSFET 131 is turned to 'OFF' state, resetting of the photodiode 132 is released, and storage of a signal charge corresponding to incident light is started. At instant t2 in the next frame, a first readout period is started. That is, the row-selecting signal supplied to the terminal 138 goes 'High'. Then, a signal voltage corresponding to electric charge stored in the photodiode 132 is read out to the node 139 through the MOSFETs 133 and 134. This signal voltage is supplied to one terminal of the capacitor 263 as the sample-and-hold signal applied to the terminal 262 goes 'High', turning the MOSFET 261 to 'ON' state. At the same time, the 'ON/OFF' control signal applied to the terminal 266 also goes 'High', turning the switching MOSFET 265 to 'ON' state. So, the potential at the node 264 with which the other terminal of the capacitor 263 is connected is set to the constant potential $V_{ref}$ supplied via the terminal 267. Then, the 'ON/OFF' control signal supplied to the terminal 266 goes 'Low', turning the switching MOSFET 265 to 'OFF' state, so that the node 264 is floated. Subsequently, at instant t3, the reset signal applied to the terminal 136 from the vertical scanning circuit goes 'High'. So, the potential at the node 137 within the pixel 130 is reset and becomes the power-supply voltage $V_{cc}$ supplied from the terminal 135. A signal voltage corresponding to this power-supply voltage $V_{cc}$ appears at the node 139 through the source-follower made up of the signal amplification MOSFET 133, the row-selecting MOSFET 134 and the current source 140. The reset signal goes 'Low' around instant t4, at which the sample-and-hold signal supplied to the terminal 262 goes 'High' and the second readout period is started. Consequently, a signal voltage corresponding to the reset state of the photodiode 132 appearing at the node 139 is applied to one terminal of the capacitor 263 through the MOSFET 261. Since the node 264 is floating, the potential at the node 264 varies by an amount equal to the difference between the signal voltage read out during the first readout period and the signal voltage read out during the second readout period, under the capacitive coupling.

So, in this embodiment, the effects of variations of the characteristics values of the signal amplification MOSFET 133 within the pixel 130 can be reduced by taking the difference between the signal voltage corresponding to the state in which incident light is applied to the photodiode 132 and the signal voltage corresponding to the reset state of the photodiode 132.

Then, a signal corresponding to the potential at the node 264 is output through the source-follower to the terminal 273, the source-follower consisting of the signal amplification MOSFET 268, the column-selecting MOSFET 269 and the current source 272, in the same way as the readout portion 141 shown in FIG. 5.

FIG. 11 is a circuit diagram of a black-level signal generation circuit in accordance with the third embodiment. The black-level signal generation circuit in accordance with this embodiment is similar in circuit configuration with the readout portion 260 shown in FIG. 9, except that the MOSFET 261, the capacitor 263, and the terminal 262 are excluded. The corresponding MOSFETs are identical in size.

As shown in FIG. 11, a node 64 is connected with the drain of a switching MOSFET 65 of an N-channel type and with the gate of a signal amplification MOSFET 68 of an N-channel type. The gate of the switching MOSFET 65 is connected with a terminal 66 to which a high level signal is kept supplied always. The source of the switching MOSFET 65 is connected with a terminal 67. A constant voltage $V_{ref}$ is supplied to the source of the switching MOSFET 65 via the terminal 67 at all times. A high level is supplied to the gate of the switching MOSFET 65, and so the potential at the node 64 is also put at this constant voltage $V_{ref}$. The drain of the signal amplification MOSFET 68 is connected with a terminal 70 via which the power-supply voltage $V_{cc}$, for example, is supplied. The source of the signal amplification MOSFET 68 is connected with the drain of an N-channel MOSFET 69 whose gate is connected with a terminal 71. A signal at high level is kept supplied always via the terminal 71. The source of the MOSFET 69 is connected with one end of a current source 72 and with a terminal 73. The other end of the current source 72 is grounded. In the black-level signal generation circuit constructed in this way, a black-level signal corresponding to the potential at the node 64 is output to the output signal line from the terminal 73.

The black-level signal created in this manner is applied to the signal level adjusting circuit shown in FIG. 4. In this signal level adjusting circuit, the input black-level signal is used to match the black-level of the output signal from the signal level adjusting circuit to the level of the lower voltage side of the input voltage range of a A/D converter to which the output signal from the signal level adjusting circuit is applied.

It is possible to add circuit elements corresponding to the pixel 130 and the MOSFET 261 and the capacitor 263 of the readout portion 260 which are shown in FIG. 9 to the circuit configuration of the black-level signal generation circuit shown in FIG. 11. However, a signal at high level is kept supplied to the terminal 66, and the potential at the node 64 is clamped at the constant voltage $V_{ref}$ supplied to the terminal 67, so that the level of the black-level signal does not depend on whether these circuit elements are present. Accordingly, in the black-level signal generation circuit in accordance with the present embodiment, circuit elements corresponding to the pixel 130, MOSFET 261 and capacitor 263 are omitted. In the present embodiment, the switching MOSFET 65 is mounted. This MOSFET 65 may be replaced by a conductor, and the terminal 67 may be connected with the node 64 to directly supply the constant voltage $V_{ref}$ to the node 64. When the black-level signal is not necessary, if a signal of low level is supplied to the terminal 71, the outputting of the black-level signal is stopped. Hence, electric power consumption can be curtailed.

Figure 12:
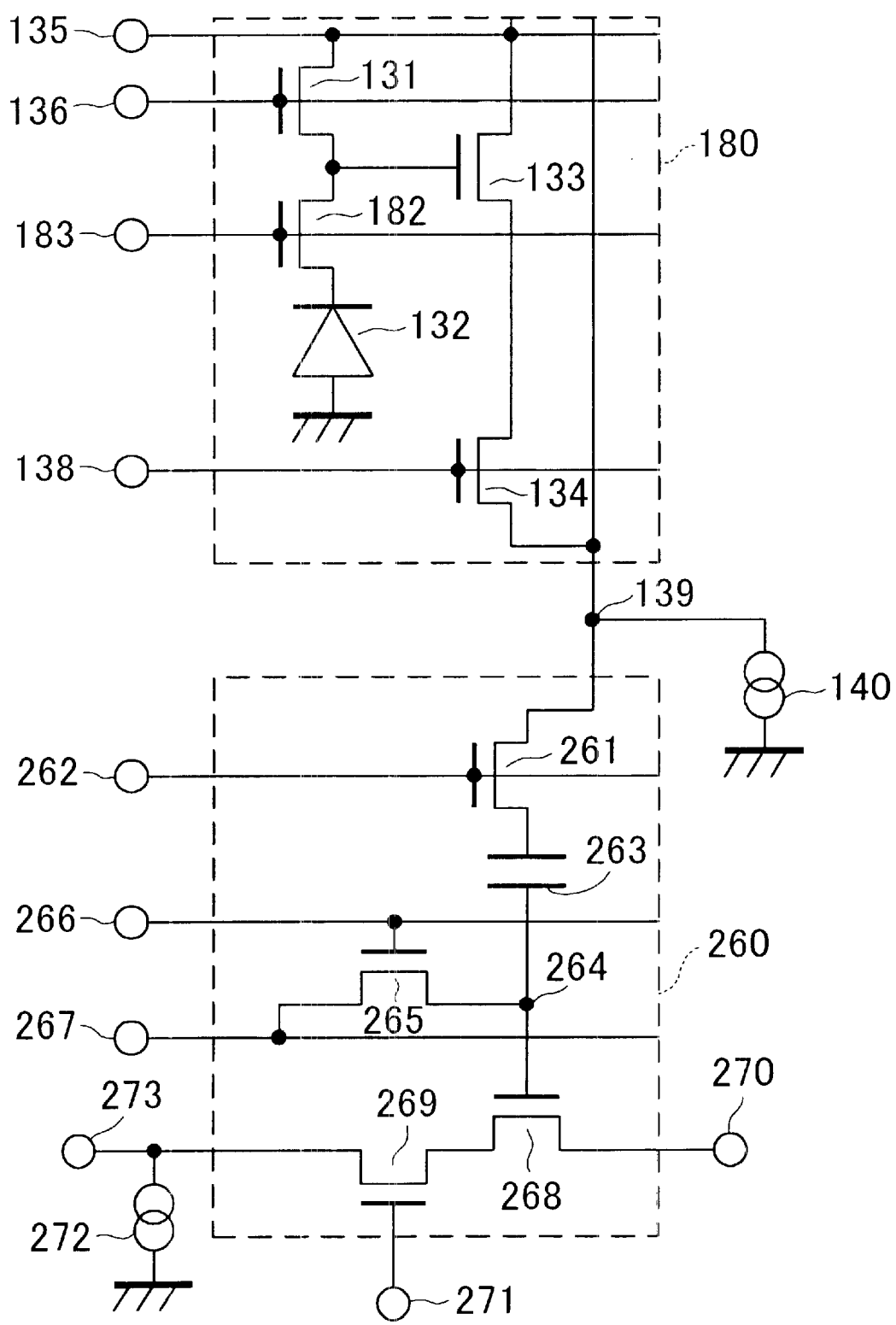
FIG. 12 is a circuit diagram of a pixel and a readout portion in accordance with a fourth embodiment of the present invention.

FIG. 12 is a circuit diagram showing a pixel and a readout portion in accordance with a fourth embodiment of the present invention. Since a readout portion 260 in accordance with the present embodiment is the same as that of the third embodiment shown in FIG. 9, the readout portion will not be repeatedly described. A pixel 180 in accordance with the present embodiment is identical in configuration with that of the second embodiment, and has the structure such as the pixel 130 of the third embodiment shown in FIG. 9 added a charge-transferring MOSFET. That is, in the pixel 180 in accordance with the present embodiment, a charge-transferring MOSFET 182 is added between a photodiode 132 and a gate terminal of the signal amplification MOSFET 133. The source and drain of the charge-transferring MOSFET 182 are connected with one end of the photodiode 132 and the gate of the signal amplification MOSFET 133, respectively. The gate of the charge-transferring MOSFET 182 is connected with a terminal 183, which in turn supplies a signal at high level at all times.

The black-level signal generation circuit in accordance with the present embodiment is the same as that of the third embodiment shown in FIG. 9. Alternatively, a circuit that the MOSFET 65 is replaced by a electric conductor may be used instead of the circuit shown in FIG. 9.

In the drawings and specification, there have been disclosed typical preferred embodiments of the invention and, although specific terms are employed, they are used in a generic and descriptive sense only and not for purposes of limitation, the scope of the invention being set forth in the following claims. For example, the present invention may be applied to one-dimensional image sensor in addition to two-dimensional image sensors as described above as embodiments of the present invention. The reset voltage of each photo-sensor may be different from the power-supply potential at the terminals 135 and 35.

What is claimed is:

1. An image sensor comprising a plurality of pixels, each of said pixels having a photo-sensor and a signal producing circuit cooperating with said photo-sensor to produce a signal at its output terminal, and a black-level signal generation circuit constructed to generate at its output node a black-level signal that is substantially equivalent to such a signal that is outputted by said pixel upon being subjected to a reset state.

2. The image sensor as claimed in claim 1, wherein said signal producing circuit includes a first transistor coupled between said photo-sensor and a reset potential line, a first capacitor, a second transistor coupled between said first capacitor and a first power potential line and having a gate coupled to said photo-sensor, and a third transistor coupled between a second power potential line and said output terminal and having a gate coupled to said capacitor, and said black-level signal generation circuit includes an additional photo-sensor, a fourth transistor coupled between said additional photo-sensor and said reset potential line, a second capacitor, a fifth transistor coupled between said second capacitor and said first power potential line and having a gate coupled to said additional photo-sensor, and a sixth transistor coupled between said second power potential line and said output node and having a gate coupled to said second capacitor.

3. The image sensor as claimed in claim 1, wherein said signal producing circuit includes a first transistor coupled between said photo-sensor and a reset potential line, a first capacitor, a second transistor coupled between said first capacitor and a first power potential line and having a gate coupled to said photo-sensor, and a third transistor coupled between a second power potential line and said output terminal and having a gate coupled to said capacitor, and said black-level signal generation circuit includes a fourth transistor coupled between a first circuit node and said reset potential line, a fifth transistor coupled between a second circuit node and said first power potential line and having a gate coupled to said first circuit node, and a sixth transistor coupled between said second power potential line and said output node and having gate coupled to said second circuit node.

4. The image sensor as claimed in claim 1, wherein said signal producing circuit includes a first transistor coupled between said photo-sensor and a reset potential line, a first capacitor having first and second ends, a second transistor coupled between the first end of said first capacitor and a first power potential line and having a gate coupled to said photo-sensor, a third transistor coupled between the second end of said first capacitor and a reference potential line, and a fourth transistor coupled between said first power potential line and said output terminal and having a gate coupled to the second end of said first capacitor, and said black-level signal generation circuit includes an additional photo-sensor, a fifth transistor coupled between said additional photo-sensor and said reset potential line, a second capacitor having first and second ends, a sixth transistor coupled between the first end of said second capacitor and said first power potential line and having a gate coupled to said additional photo-sensor, a seventh transistor coupled between the second end of said second capacitor and said reference potential line, and an eighth transistor coupled between said first power potential line and said output node and having gate coupled to the second end of said second capacitor.

5. The image sensor as claimed in claim 1, wherein said signal producing circuit includes a first transistor coupled between said photo-sensor and a reset potential line, a first capacitor having first and second ends, a second transistor coupled between the first end of said first capacitor and a first power potential line and having a gate coupled to said photo-sensor, a third transistor coupled between the second end of said first capacitor and a reference potential line, and a fourth transistor coupled between said first power potential line and said output terminal and having a gate coupled to the second end of said first capacitor, and said black-level signal generation circuit includes a fifth transistor coupled between said reference potential line and a first circuit node and a sixth transistor coupled between said first power potential line and said output node and having a gate coupled to said first circuit node.

6. A MOS-based image sensor comprising:
   a light-receiving element producing an output signal;
   a signal path MOS transistor circuit including a plurality of MOS transistors and forming a transmission path for the output signal from said light-receiving element;
   a black-level signal generation circuit having at least some of circuit elements which are equivalent in function to said light-receiving element and circuit elements included in said signal path MOS transistor circuit, said black-level signal generation circuit being equivalent in circuit configuration to said light-receiving element and said signal path MOS transistor circuit, said black-level signal generation circuit creating a black-level signal of a constant level that is substantially equivalent to a pixel signal produced from said signal path MOS transistor circuit when said light-receiving element is in a reset state, said black-level signal generation circuit producing the black-level signal of the constant level at all times; and
   a signal level adjusting circuit for receiving said pixel signal from said signal path MOS transistor circuit and said black-level signal from said black-level signal generation circuit and acting to adjust said pixel signal by said black-level signal.

7. The MOS-based image sensor of claim 6, wherein at least some of the circuit elements which can be included in said black-level signal generation circuit corresponding to the circuit elements included in said light-receiving element and said signal path MOS transistor circuit and which can be omitted or replaced with an electric conductor without substantially affecting a level value of the black-level signal produced from said black-level signal generation circuit are omitted or replaced with the electric conductors.

8. The MOS-based image sensor of claim 6, wherein the MOS transistors included in said black-level signal generation circuit whose corresponding MOS transistors are turned 'ON/OFF' in said signal path MOS transistor circuit are supplied a power-supply voltage or ground potential to their gates, whereby said MOS transistors are kept 'ON'.

9. The MOS-based image sensor of claim 6, wherein each of the circuit elements included in said black-level signal generation circuit are equivalent in size to corresponding circuit elements of said light-receiving element and said signal path MOS transistor circuit respectively.

10. A MOS-based image sensor comprising:
    pixels arranged in a plurality of rows and a plurality of columns and having light-receiving elements, said pixels having a function of transferring pixel signals obtained from said light-receiving elements to vertical signal lines;
    readout portions arranged to correspond to said vertical signal lines, respectively, said readout portions forming a transmission path for the pixel signals transferred from said pixels to said vertical signal lines;
    a black-level signal generation circuit having at least some of circuit elements which are equivalent in function to circuit elements included in any one of said pixels and any one of said readout portions, said black-level signal generation circuit being equivalent in circuit configuration to any one of said pixels and any one of said readout portions, said black-level signal generation circuit forming a black-level signal of a constant level that is substantially equivalent to a pixel signal produced from any one of said readout portions when said light-receiving elements are in a reset state; and
    a signal level adjusting circuit for receiving said pixel signals from said signal readout portions and said black-level signal from said black-level signal generation circuit and acting to adjust said pixel signals by said black-level signal.

11. The MOS-based image sensor of claim 10, wherein at least some of the circuit elements which can be included in said black-level signal generation circuit corresponding to the circuit elements included in any one of said pixels and any one of said readout portions and which can be omitted or replaced with electric conductors without substantially affecting a level value of the black-level signal produced from said black-level signal generation circuit are omitted or replaced with the electric conductors.

12. The MOS-based image sensor of claim 10, wherein the MOS transistors included in said black-level signal generation circuit whose corresponding MOS transistors are turned 'ON/OFF' in any one of said pixels and any one of said readout portions are supplied a power-supply voltage or ground potential to their gates, whereby said MOS transistors are kept 'ON'.

13. The MOS-based image sensor of claim 10, wherein each of the circuit elements included in said black-level signal generation circuit is equivalent in size to corresponding circuit elements of any one of said pixels and any one of said readout portions respectively.

14. The MOS-based image sensor of claim 10, wherein each of said pixels includes:
    a resetting transistor for resetting said light-receiving element, said resetting transistor having a drain connected with a constant potential source and a source connected with one end of said light-receiving element;

a first signal amplification transistor having a gate connected with the source of said resetting transistor and a drain connected with the constant potential source; and a row-selecting transistor having a drain connected with the source of said first signal amplification transistor, a gate to which a row-selecting signal is applied, and a source connected with a vertical signal line supplied with an electric current from a first current source.

15. The MOS-based image sensor of claim 14, wherein said black-level signal generation circuit has at least transistors corresponding to the resetting transistor, first signal amplification transistor, and row-selecting transistor in any one of said pixels.

16. The MOS-based image sensor of claim 10, wherein each of said pixels includes:

a resetting transistor for resetting said light-receiving element, said resetting transistor having a drain connected with a constant potential source;

a charge-transferring transistor having a drain connected with the source of said resetting transistor and a source connected with one end of said light-receiving element;

a first signal amplification transistor having a gate connected with the source of said resetting transistor and a drain connected with the constant potential source; and a row-selecting transistor having a gate to which row-selecting signal is applied, a drain connected with the source of said first signal amplification transistor, and a source connected with a vertical signal line supplied with an electric current from a first current source.

17. The MOS-based image sensor of claim 16, wherein said black-level signal generation circuit has at least transistors corresponding to the resetting transistor, the first signal amplification transistor, and the row-selecting transistor in any one of said pixels.

18. The MOS-based image sensor of claim 10, wherein each of said signal readout portions includes:

a sample-and-hold transistor having a gate to which a sample-and-hold signal is applied and a drain connected with a vertical signal line supplied with an electric current from a first current source;

a sample-and-hold capacitor having one end connected with the source of said sample-and-hold transistor and the other end connected with a constant potential source;

a second signal amplification transistor having a gate connected with the source of said sample-and-hold transistor and a drain connected with a constant potential source; and a column-selecting transistor having a drain connected with the source of said second signal amplification transistor and a gate to which a column-selecting signal is applied and a source connected with an output signal line supplied with an electric current from a second current source.

19. The MOS-based image sensor of claim 18, wherein said black-level signal generation circuit has transistors corresponding to at least the second signal amplification transistor and the column-selecting transistor in any one of said signal readout portions.

20. The MOS-based image sensor of claim 10, wherein each of said signal readout portions includes:

a sample-and-hold transistor having a gate to which a sample-and-hold signal is applied and a drain connected with a vertical signal line supplied with an electric current from a first current source;

a signal detection capacitor used for detection of a signal, said capacitor having one end connected with the source of said sample-and-hold transistor;

a reference potential-setting transistor used for setting a reference potential, said reference potential-setting transistor having a source connected with a reference potential source and a drain connected with the other end of said signal detection capacitor;

a second signal amplification transistor having a gate connected with the drain of said reference potential-setting transistor and a drain connected with a constant potential source; and a column-selecting transistor having a gate to which a column-selecting signal is applied, a drain connected with the source of said second signal amplification transistor, and a source connected with an output signal line supplied with an electric current from a third current source.

21. The MOS-based image sensor of claim 20, wherein said black-level signal generation circuit has transistors corresponding to at least the second signal amplification transistor and the column-selecting transistor in any one of said signal readout portions.

22. The MOS-based image sensor of claim 10, wherein said black-level signal generation circuit does not have any circuit elements corresponding to the circuit elements included in said pixels.

* * * * *